(12) United States Patent
Magnus

(10) Patent No.: US 8,822,268 B1
(45) Date of Patent: Sep. 2, 2014

(54) REDISTRIBUTED CHIP PACKAGES CONTAINING MULTIPLE COMPONENTS AND METHODS FOR THE FABRICATION THEREOF

(71) Applicant: Alan J. Magnus, Gilbert, AZ (US)

(72) Inventor: Alan J. Magnus, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/944,774

(22) Filed: Jul. 17, 2013

(51) Int. Cl.
- H01L 21/00 (2006.01)
- H01L 23/498 (2006.01)
- H01L 21/78 (2006.01)

(52) U.S. Cl.
CPC .......... H01L 23/49811 (2013.01); H01L 21/78 (2013.01)
USPC .... 438/107; 438/109; 438/110; 257/E21.602; 257/723; 257/724

(58) Field of Classification Search
CPC ................. H01L 2924/01079; H01L 2924/14; H01L 2924/01029
USPC .......... 257/E21.602, E25.001, 292, 431, 433, 257/678, 723, 724, 728, 737, 787; 438/106, 438/107, 109, 110, 119, 618, 679, 680
See application file for complete search history.

(56) References Cited

U.S. PATENT DOCUMENTS

| | | | | |
|---|---|---|---|---|
| 5,250,843 A * | 10/1993 | Eichelberger | ................. | 257/692 |
| 5,353,498 A * | 10/1994 | Fillion et al. | .................... | 29/840 |
| 6,420,244 B2 | 7/2002 | Lee | | |
| 6,836,025 B2 * | 12/2004 | Fujisawa et al. | .............. | 257/782 |
| 7,048,450 B2 * | 5/2006 | Beer et al. | ........................ | 385/88 |
| 7,476,563 B2 * | 1/2009 | Mangrum et al. | ............ | 438/106 |
| 7,619,901 B2 * | 11/2009 | Eichelberger et al. | ........ | 361/763 |
| 7,741,151 B2 * | 6/2010 | Amrine et al. | ................ | 438/107 |
| 7,767,496 B2 * | 8/2010 | Shim et al. | .................... | 438/118 |
| 7,799,602 B2 * | 9/2010 | Pagaila et al. | ................. | 438/106 |
| 7,838,420 B2 | 11/2010 | Tang et al. | | |
| 7,902,661 B2 * | 3/2011 | Smeys et al. | .................. | 257/698 |
| 8,174,119 B2 | 5/2012 | Pendse | | |
| 8,227,927 B2 * | 7/2012 | Chen et al. | ..................... | 257/797 |
| 8,263,439 B2 * | 9/2012 | Marimuthu et al. | .......... | 438/126 |
| 8,378,466 B2 * | 2/2013 | Chiu et al. | ..................... | 257/660 |
| 2005/0124093 A1 * | 6/2005 | Yang et al. | .................... | 438/110 |
| 2008/0123318 A1 | 5/2008 | Lam | | |
| 2010/0081234 A1 | 4/2010 | Lytle | | |
| 2010/0123217 A1 * | 5/2010 | Poeppel et al. | ............... | 257/536 |

OTHER PUBLICATIONS

Magnus, A., U.S. Appl. No. 13/688,820, filed Nov. 29, 2012.

* cited by examiner

Primary Examiner — Chris Chu
(74) Attorney, Agent, or Firm — Ingrassia Fisher & Lorenz, P.C.

(57) ABSTRACT

Embodiments of a method for fabricating Redistributed Chip Packages are provided, as are embodiments of Redistributed Chip Packages. In one embodiment, the method includes the steps/processes of embedding a first semiconductor die and a microelectronic component in a molded panel having a frontside, the first semiconductor die comprising a plurality of bond pads over which a plurality of raised contacts has been formed. The frontside of the molded panel is polished to impart the molded panel with a substantially planar surface through which the terminals of the microelectronic component and the plurality of raised contacts are exposed. Finally, at least one redistribution layer is build or produced over the substantially planar surface to electrically interconnect the first semiconductor die and the microelectronic component.

20 Claims, 8 Drawing Sheets

REDISTRIBUTED CHIP PACKAGES CONTAINING MULTIPLE COMPONENTS AND METHODS FOR THE FABRICATION THEREOF

TECHNICAL FIELD

Embodiments of the present invention relate generally to microelectronic packaging and, more particularly, to Redistributed Chip Packages containing multiple components and methods for the fabrication thereof.

BACKGROUND

Fan-Out Wafer Level Packaging (FO-WLP) processes are well-known within the semiconductor industry for producing microelectronic packages having peripheral fan-out areas, which enlarge the surface area of the package topside over which the contact array is formed. One known FO-WLP approach may be referred to as "Redistributed Chip Packaging" or "RCP" packaging approach. In an example of an RCP packaging approach, a pick-and-place tool is utilized to position an array of semiconductor die within the central opening of a taped mold frame. An encapsulant is then dispensed into the mold frame and over the array of semiconductor die. The encapsulant is partially cured to produce a molded panel in which the array of semiconductor die are embedded. The taped mold frame is removed to reveal the frontside of the molded panel through which the semiconductor die are exposed. After backside grinding and additional curing of the panel, a carrier is attached to the panel backside to allow a number of build-up layers or Redistribution Layers (RDLs) and a Ball Grid Array (BGA) or other contact array to be formed over the frontside of the die exposed through the panel. The RDL layers include successively-deposited dielectric layers in which a number of metal traces and plugs are formed to provide electrically-conductive paths between the bond pads of the embedded die and the overlying BGA. Finally, the molded panel is singulated to yield a number of RCP packages each containing a different encapsulated semiconductor die.

BRIEF DESCRIPTION OF THE DRAWINGS

At least one example of the present invention will hereinafter be described in conjunction with the following figures, wherein like numerals denote like elements, and.

Figure 1:
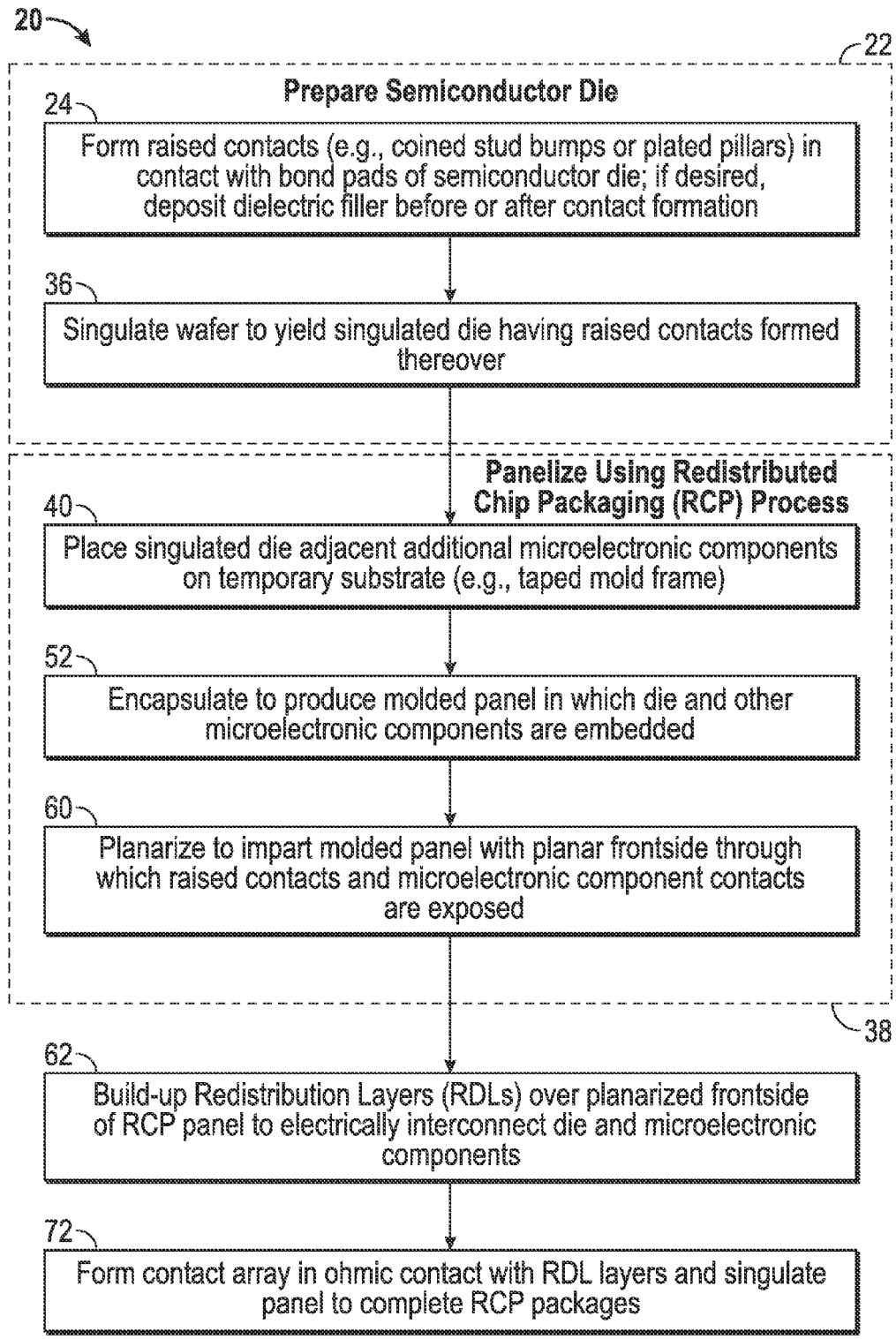
FIG. 1 is a flowchart illustrating a method for fabricating an RCP package containing a semiconductor die and at least one additional microelectronic component, as illustrated in accordance with an exemplary and non-limiting embodiment of the present invention.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably and that embodiments of the invention are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical manner. Furthermore, the terms "substantial" and "substantially" are utilized to indicate that a particular feature or condition is sufficient to accomplish a stated purpose in a practical manner and that minor imperfections or variations, if any, are not significant for the stated purpose.

The term "microelectronic component" is utilized in a broad sense to refer to an electronic device, element, or structure produced on a relatively small scale and amenable to packaging in the below-described manner. Microelectronic components include, but are not limited to, integrated circuits formed on semiconductor die, Microelectromechanical Systems (MEMS) devices, passive electronic components (e.g., a discrete capacitor, inductor, or resistor), optical devices, and other small scale electronic devices capable of providing processing, memory, sensing, radiofrequency, optical, and actuator functionalities, to list but a few examples. Microelectronic components also include other discrete or separately-fabricated structures that can be integrated into a microelectronic package, such as prefabricated via structures and prefabricated antenna structures. The terms "System-in-Package," "SiP," and "SiP package" are further utilized herein to refer to a microelectronic package including at least one semiconductor die packaged and electrically interconnected with at least one passive microelectronic component. The term "raised contact," as appearing herein, is utilized in a broad sense to refer to an electrically-conductive body or structure formed over the frontside of a semiconductor die and extending away therefrom by a distance sufficient to allow the raised contacts to be partially removed without damaging the die during the below-described planarization process. Finally, the term "terminal" may be utilized herein to refer to a node, lead, or other point-of-contact provided on a microelectronic device, as previously defined.

It is desirable to produce microelectronic packages wherein semiconductor die are packaged with other types of microelectronic components having terminals or contacts that vary in shape, structure, and/or disposition as compared to the bond pads of the semiconductor die. For example, it may be desirable to package one or more semiconductor die with one or more passive microelectronic devices, such as a discrete capacitor, inductor, or resistor; one or more leaded packages, such as a dual or quad flat package; one or more no-lead packages, such as a dual or quad flat no-lead package; or a combination thereof. Certain difficulties may be encountered, however, when employing conventional RCP processes to encapsulate semiconductor die along with microelectronic components including terminals that differ as compared to the semiconductor die bond pads. For example, due to the irregular shape, structure, or disposition of the terminals of the microelectronic components, overmolding of the semiconductor die along with their neighboring microelectronic components may produce a molded panel having a non-planar upper or frontside surface due to, for example, the presence of excessive mold flash. Topological irregularities present on the frontside of the molded panel may be transferred to, and become increasingly pronounced within, each successively-deposited RDL layer. Such topological irregularities can thus lead to defects within the RDL layers, inadequate electrical insulation or physical contact between neighboring interconnect lines within the RDL layers, and an increased likelihood of electrical short. An overall reduction in yield may result.

To overcome the above-noted limitations, the following describes exemplary embodiments of a method for fabricating RCP packages wherein a relatively smooth or planar frontside surface is created over a molded panel containing semiconductor as well as one or more additional microelectronic components, which may have terminals that vary in shape, structure, and/or disposition as compared to the semiconductor die bond pads. By imparting the frontside of the molded panel with such a planar surface, the below-described fabrication method reduces or eliminates surface defects transferred to the subsequently-deposited RDL layers to increase product yield. In preferred embodiments, the planar frontside surface is produced by subjecting the molded panel to a planarization or polishing process after encapsulation of the semiconductor die and other microelectronic components. To shield the semiconductor die from undesired material loss and potential damage during polishing, a plurality of raised contacts may be formed over the bond pads of the semiconductor die prior to encapsulation. By comparison, the relatively thick terminals of the microelectronic components packaged with the semiconductor die may be partially removed during the polishing process without damage thereto. Furthermore, controlled removal of the uppermost portions of the microelectronic component terminals may provide one or more benefits, as described in detail below.

FIG. 1 is a flowchart setting-forth a method 20 for producing RCP packages, some or all of which contain at least one semiconductor die packaged with at least one additional microelectronic component. The additional microelectronic component or components with which the semiconductor die is packaged may be, for example, a leaded package, a no-lead package, a passive microelectronic device (e.g., a discrete capacitor, inductor, or resistor); a prefabricated structure or device (e.g., a prefabricated antenna or via); an integrated circuit carried by a semiconductor die; an optical device; a MEMS device; another small scale device capable of providing processing, memory, sensing, radiofrequency, optical, and/or actuator functionalities; or a combination thereof. As shown in FIG. 1 and described in detail below, method 20 is offered by way of non-limiting example only. It is emphasized that the fabrication steps shown in FIG. 1 can be performed in alternative orders, that certain steps may be omitted, and that additional steps may be performed in alternative embodiments. Furthermore, various steps in the manufacture of microelectronic packages or certain components included within the microelectronic packages described below (e.g., microelectronic device panels produced using Redistributed Chip Packaging techniques generally) are well-known and, in the interests of brevity, will only be mentioned briefly herein or will be omitted entirely without providing the well-known process details. While described below in conjunction with the manufacture of an exemplary RCP package, as illustrated at various stages of completion in FIGS. 2-7, it will be appreciated that exemplary method 20 can be utilized to produce various other types of RCP packages.

Figure 2:
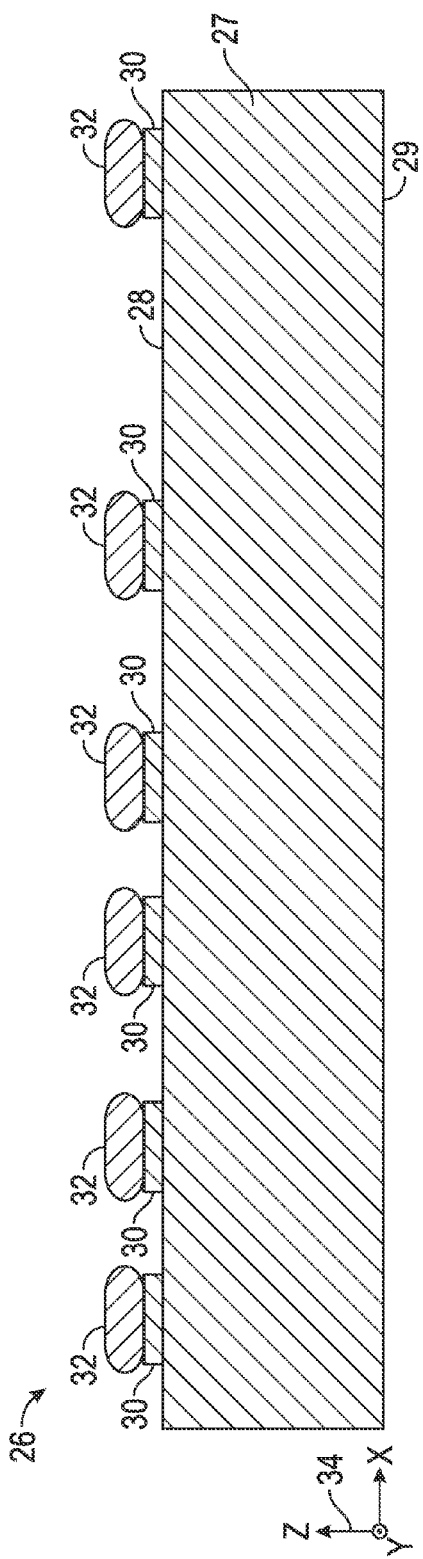
FIGS. 2-7 illustrate a first exemplary RCP package containing a semiconductor die having a first type of raised contacts (e.g., coined stud bumps) formed thereover, as shown at various stages of completion and produced in accordance with the exemplary fabrication method shown in FIG. 1.

Exemplary method 20 commences with the preparation of a number of semiconductor die for RCP panelization (PROCESS BLOCK 22, FIG. 1). At this juncture in the fabrication process, the semiconductor die have undergone wafer-level processing to produce at least one semiconductor device (e.g., a number of transistors interconnected to form an integrated circuit) and a number of bond pads on each semiconductor die. The non-singulated wafer is now further processed to form raised contacts over the upper surfaces or frontsides of the semiconductor die fabricated on the wafer (STEP 24, FIG. 1). Further illustrating this step, FIG. 2 is a side view of an exemplary semiconductor die 26 including an upper principal surface or frontside 28 and an opposing lower principal surface or backside 29. A number of bond pads 30 have been formed over frontside 28 and are distributed along the die plane in, for example, a grid arrangement. Furthermore, pursuant to STEP 24 of exemplary method 20 (FIG. 1), a plurality of raised contacts 32 has been formed over semiconductor die 26 in ohmic contact with bond pads 30. In particular, one raised contact 32 has been deposited directly on each bond pad 30 of semiconductor die 26 and provides ohmic contact thereto.

In the exemplary embodiment show in FIG. 2, raised contacts 32 assume the form of stud bumps; that is, conducive bodies having a generally spherical or globular shape and conveniently formed utilizing the capillary of a wirebonding tool, while lacking a bond wire extending therefrom. The stud bumps are preferably coined or flattened after initial formation to eliminate any surface irregularities resulting from the termination or "pinching-off" of the wire during bumping. Coining of the stud bumps may be accomplished by, for example, flattening the uppermost portion of the stud bumps utilizing a tool similar to a wirebonding capillary, but lacking a channel therethrough and having a substantially flat lower contact surface, which is heated and pressed against the stud bumps after initial deposition thereof. Coining of the stud bumps ensures that semiconductor die 26 seats properly on the temporary substrate utilized during the RCP panelization process described below in conjunction with PROCESS BLOCK 38 of exemplary method 20 (FIG. 1). The stud bumps are conveniently formed from gold, aluminum, or copper wire, although any suitable electrically-conductive material may be used. In further embodiments, raised contacts 32 may assume other forms, such as plated pillars of the type described below in conjunction with FIGS. 8 and 9.

As noted above, raised contacts 32 provide ohmic contact to underlying bond pads 30 of semiconductor die 26. Additionally, raised contacts 32 provide a desired vertical standoff or Z-axis clearance protecting die 26 from material loss and potential damage during the below-described planarization process. Raised contacts 32 may have any height suitable for protecting bond pads 30 of die 26 in this manner. While the height of contacts 32 will vary amongst different embodiments, raised contacts 32 will typically be formed to have a height greater than the thickness of bond pads 30, as taken along an axis orthogonal to frontside surface 28 or along the Z-axis in FIG. 2 (identified by coordinate legend 34). Raised contacts 32 will also typically be formed to have a height greater than and, more preferably, at least twice the material thickness removed from the molded RCP panel during polishing. In one embodiment, raised contacts 32 are each formed to have a height between about 5 and about 20 micron (μm) and, more preferably, a height between about 8 and about 12 μm. In further embodiments, raised contacts 32 may have heights greater than or less than the aforementioned ranges. Although raised contacts 32 will typically be formed to have a substantially uniform height, raised contacts 32 can be formed to have varying heights in certain embodiments and may be imparted with substantially uniform heights after material removal during the below-described planarization process.

As will the heights of contacts 32, the planform shape and dimensions of raised contacts 32 will vary amongst different embodiments. In many cases, the planform dimensions of raised contact 32 will be similar to the planform dimensions of the underlying bond pad 30 over which contact 32 are formed. For example, in illustrated embodiment wherein raised contacts 32 assume the form of stud bumps, each stud bump may be deposited to have an outer diameter substantially equivalent to the width of the bond pad over which the raised contact 32 is formed; the term "substantially equivalent," appearing herein, denoting a disparity of less than 10%. In other embodiments, raised contacts 32 may be formed to have planform dimensions that vary more drastically with respect to the planform dimensions of the underlying bond pads 30. For example, in embodiments wherein the spacing between raised contacts 32 is not constrained by the pitch of bond pads 30, it may be desirable to impart raised contacts 32 with enlarged dimensions to facilitate ohmic contact with the interconnects included within the subsequently-formed RDL layers. Conversely, in implementations wherein die 26 is fabricated to include bond pads having a relatively tight pitch, it may be desirable to impart raised contacts 32 with reduced planform dimensions relative to the bond pads.

For reasons of efficiency, it is preferred that raised contacts 32 are formed over semiconductor die 26 prior to wafer singulation; that is, while die 26 remain integrally joined to other semiconductor die in wafer form (not shown in FIG. 2). In this case, singulation of the wafer may be carried-out after formation of raised contacts 32 over semiconductor die 26 and the other semiconductor die fabricated on the wafer (STEP 36, FIG. 1). Singulation is preferably accomplished by mechanical sawing, although other dicing techniques can also be utilized, such as laser cutting or scribe and break. Dicing of the semiconductor wafer yields a plurality of singulated semiconductor die each having a number of raised contacts formed thereover, which can now undergo the RCP panelization process described below in conjunction with PROCESS BLOCK 38 of exemplary method 20 (FIG. 1). In FIG. 2, semiconductor die 26 is illustrated after wafer singulation defining the vertical sidewalls of die body 27 extending between frontside 28 and backside 29 of singulated die 26. The instant example notwithstanding, the possibility that raised contacts 32 may be formed over semiconductor die 26 after wafer singulation (e.g., by, for example, stud bumping after placing the semiconductor die on a specialized fixture similar to a waffle pack) is by no means precluded.

Exemplary method 20 continues with RCP panelization (PROCESS BLOCK 38, FIG. 1). The RCP panelization process commences with placement of semiconductor die 26 and the other newly-singulated semiconductor die along with a number of additional microelectronic components on a temporary substrate (STEP 40, FIG. 1). Testing of the semiconductor die may first be performed to ensure proper functioning. Afterwards, a pick-and-place tool may be utilized to place the known-good die facedown on the temporary substrate adjacent additional microelectronic components in one or more predetermined groupings. The predetermined groupings may include any combination of semiconductor die and microelectronic components intended for inclusion within the final RCP package. For example, each grouping may include at least one semiconductor die having raised contacts (e.g., contacts 32 shown in FIG. 2) formed thereover and at least one microelectronic component (e.g., a leaded package, a no-lead package, a passive or discrete device, etc.) having terminals or contacts that vary in shape, structure, and/or disposition as compared to the bond pads of the semiconductor die.

Figure 3:
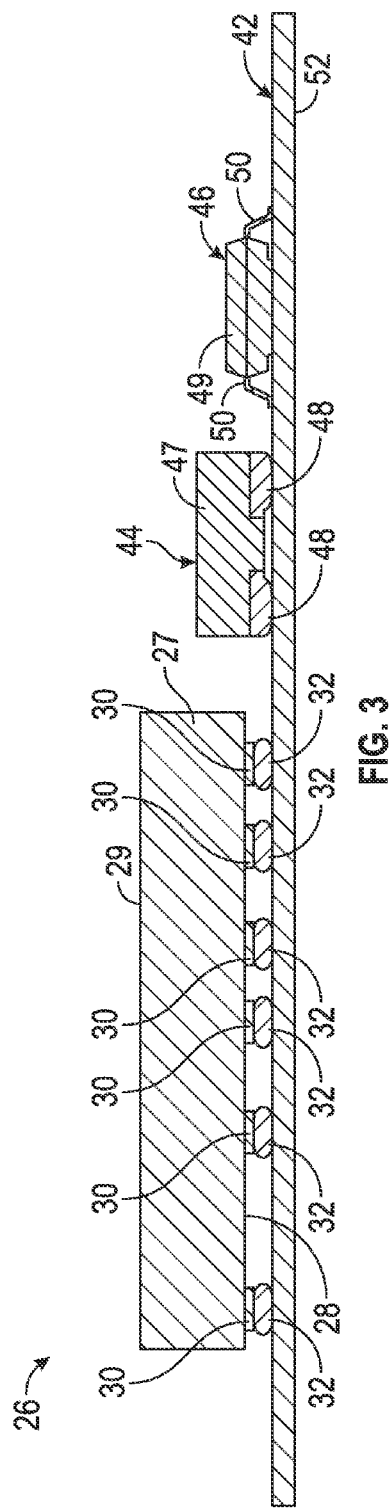

FIG. 3 illustrates semiconductor die 26 and first and second additional microelectronic component 44 after placement on a temporary substrate 42 in a predetermined grouping, as performed during STEP 40 of exemplary method 20 (FIG. 1). As can be seen in FIG. 3, semiconductor die 26 has been inverted and placed frontside down on temporary substrate 42 such that raised contacts 32 contact the upper surface of substrate 42. Similarly, microelectronic components 44 and 46 have been positioned facedown on temporary substrate 42 such that their respective contacts or terminals touch the upper surface of substrate 42. Semiconductor die 26 may be placed adjacent components 44 and 46 in a side-by-side relationship; however, die 26, component 44, and component 46 may be positioned in any spatial relationship allowing the packaging and interconnection thereof. In the illustrated embodiment, and by way of non-limiting example only, microelectronic component 44 assumes the form of a capacitor (commonly referred to as a "chip cap") including an electrically-insulative (e.g., ceramic) body 47 disposed between two electrically-conductive end pieces 48. End pieces 48 serve as the contacts of component 44 and thus are placed in contact with the upper surface of temporary substrate 42. Second microelectronic component 46, by comparison, assumes the form of a leaded package having a package body 49 from which a number of gullwing leads 50 extend. End pieces 48 of component 44 and leads 50 of component 46 may be referred to below as "terminals 48" and "terminals 50," respectively.

Temporary substrate 42 can be any body, structure, or platform suitable for supporting die 26, component 44, and component 46 during the RCP encapsulation process performed during STEP 52 of exemplary method 20 (FIG. 1). In one embodiment, temporary substrate 42 is a taped molded frame, which includes a soft tape adhesive layer 52 on which die 26, component 44, and component 46 are positioned. A non-illustrated mold frame, which has a central cavity or opening, is positioned over tape 52 and around die 26, component 44, and component 46. Encapsulation is then carried-out (STEP 52, FIG. 1). During encapsulation, an electrically-insulative encapsulant or mold compound, such as a silica-filled epoxy, is dispensed into the cavity of the mold frame and flows over die 26, components 44, and components 46, as well as the other non-illustrated die and microelectronic components positioned within the mold frame. Sufficient volume of the encapsulant is typically dispensed over the die and microelectronic components to enable the encapsulant to flow over the backside or non-contact-bearing surfaces of the microelectronic devices. The encapsulant may then be at least partially solidified by, for example, a partial oven cure to yield a solid panel body in which semiconductor die and microelectronic components, including die 26 and components 44 and 46, are embedded. The panel body is conveniently produced as a relatively thin, disc-shaped body or mass having a generally circular planform geometry; however, the panel body can be fabricated to have any desired shape and dimensions.

Figure 4:
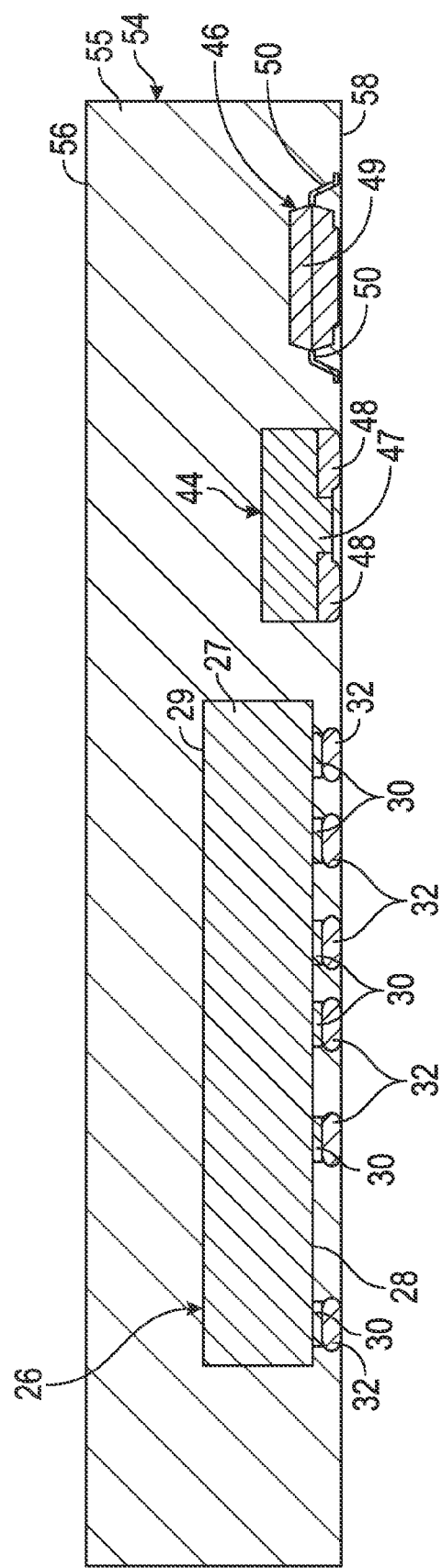

FIG. 4 illustrates a portion of a molded RCP panel 54 that may be produced pursuant to STEP 52 of method 20 (FIG. 1). While only the portion of molded panel 54 containing die 26, component 44, and component 46 is shown in FIG. 4 for clarity, it will be understood that molded panel 54 will typically be considerably larger than the illustrated portion of panel 54 and will contain various other encapsulated microelectronic components, such as other die placed in predetermined groupings with other microelectronic components similar to components 44 and 46. Molded panel 54 includes a panel body 55 having a backside surface 56 and an opposing frontside surface 58. Raised contacts 32 formed over semiconductor die 26, terminals 48 of component 44, and terminals 50 of components 46 will typically be exposed through frontside surface 58 at this stage during the manufacturing process; however, this need not always be the case as a certain amount of material will be removed from frontside surface 58 by the polishing process carried-out during STEP 60 of exemplary method 20 (FIG. 1). After curing (e.g., a partial oven cure), panel body 55 may be then released from temporary substrate 42 (FIG. 3) to reveal frontside surface 58 of panel body 55. For example, a thermal release process may be performed followed by cleaning of panel 54 to remove any adhesive residue remaining thereon. RCP panel 54 may then be fully cured by baking or another heat treatment process. If desired, backside 56 of panel body 55 may be ground or polished to bring RCP panel 54 to a desired thickness prior to release of the panel from the taped mold frame. In further embodiments, RCP panel 54 can be produced utilizing various other known fabrication techniques including, for example, compression molding and lamination processes.

Figure 5:
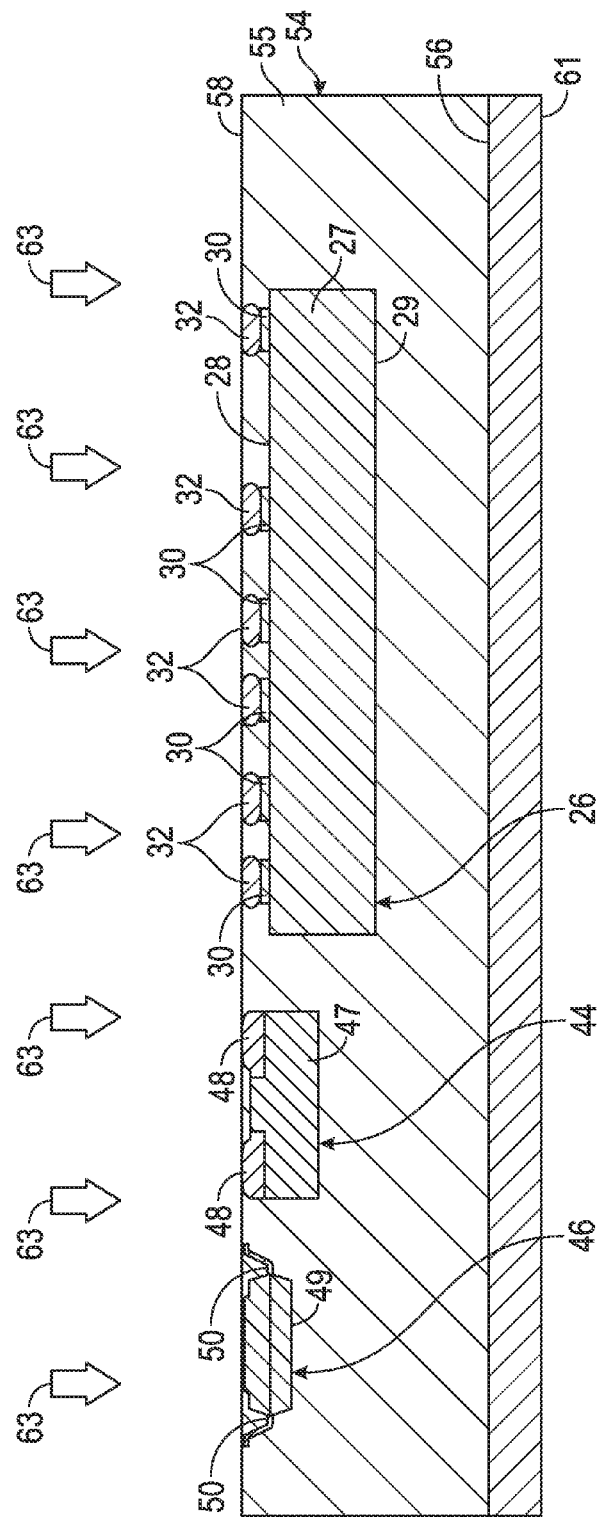

Next, during STEP 60 of method 20 (FIG. 1), planarization or polishing is carried-out to impart frontside 58 of molded RCP panel 54 with a substantially planar surface. With reference to FIG. 5, a ceramic carrier 61 may be attached to backside 56 of panel body 55, molded panel 54 may be inverted, and frontside 58 of panel 54 may be subject to planarization, as represented in FIG. 5 by arrows 63. Planarization can be carried-out utilizing any process suitable for removing a predetermined thickness from molded panel 54, while imparting frontside 58 with a substantially planar surface; that is, a relatively smooth surface having a surface roughness less than about 1.0 µm and, preferably, less than about 0.5 µm. In a preferred embodiment, a chemical mechanical planarization ("CMP") process is utilized to planarize frontside surface 58 of molded RCP panel 54. The amount of material removed during planarization will vary amongst embodiments, although it will be noted that the thickness of material removed from RCP panel 54 will generally be less than the height of raised contacts 32. As a more specific example, the thickness of material removed from frontside 58 of panel 54 during CMP polishing may be between about 1 and about 10 µm and, more preferably, between about 3 and about 5 µm. In other embodiments, the amount of material removed from panel 54 during polishing may be greater than or less than the aforementioned ranges.

As a result of the above-described planarization process, frontside surface 58 is imparted with a substantially planar topology. As illustrated in FIG. 5, raised contacts 32 formed over semiconductor die 26, terminals 48 of component 44, and terminals 50 of components 46 are exposed through frontside surface 58. As noted above, raised contacts 32 provide a vertical standoff to protect semiconductor die 26 and bond pads 30 from undesired material removal during polishing. The uppermost portions of raised contacts 32 will typically be removed during polishing such that the final height of contacts 32 may be between about 1 and about 15 µm and, more preferably, less than about 5 µm after planarization. Additionally, material may also be removed from terminals 48 of component 44 and terminals 50 of component 46, as well as from package body 49 of component 46, during polishing. A certain amount of material removal from microelectronic device terminals 48 and 50 is permissible within controlled limits as terminals 48 and 50 are relatively thick (e.g., >20 µm) as compared to bond pads 30 of semiconductor die 26 and can be partially removed via polishing without damaging components 44 and 46, respectively. Furthermore, controlled material removal from microelectronic device terminals 48 and 50 can provide several benefits. For example, the controlled removal of a portion of microelectronic device terminals 48 and 50 can effectively strip away the any undesired surface treatments applied over the contact base metal (e.g., pre-tinning), which could otherwise detract from the quality of the electrical bond formed between terminals 48 and 50 and the RDL layers formed during STEP 62 of exemplary method 20 (FIG. 1), as described below. Additionally, in embodiments wherein terminals 48 and/or terminals 50 have non-planar (e.g., curved) lower surfaces, such was when the contacts assume the form gullwing or J-shaped leads (e.g., gullwing leads 50 of component 46 shown in FIG. 5), polishing away the lower regions of the terminals can enlarge the contact area exposed through frontside 58 of molded RCP panel 54 and facilitate ohmic contact with the subsequently-deposited RDL layers. Stated differently, polishing enlarges the visible footprint of components terminals 48 and 50. In this manner, the terminals of the microelectronic component are imparted with substantially flat polished regions exposed through and substantially co-planar with the planar build-up surface of the molded body.

Figure 6:
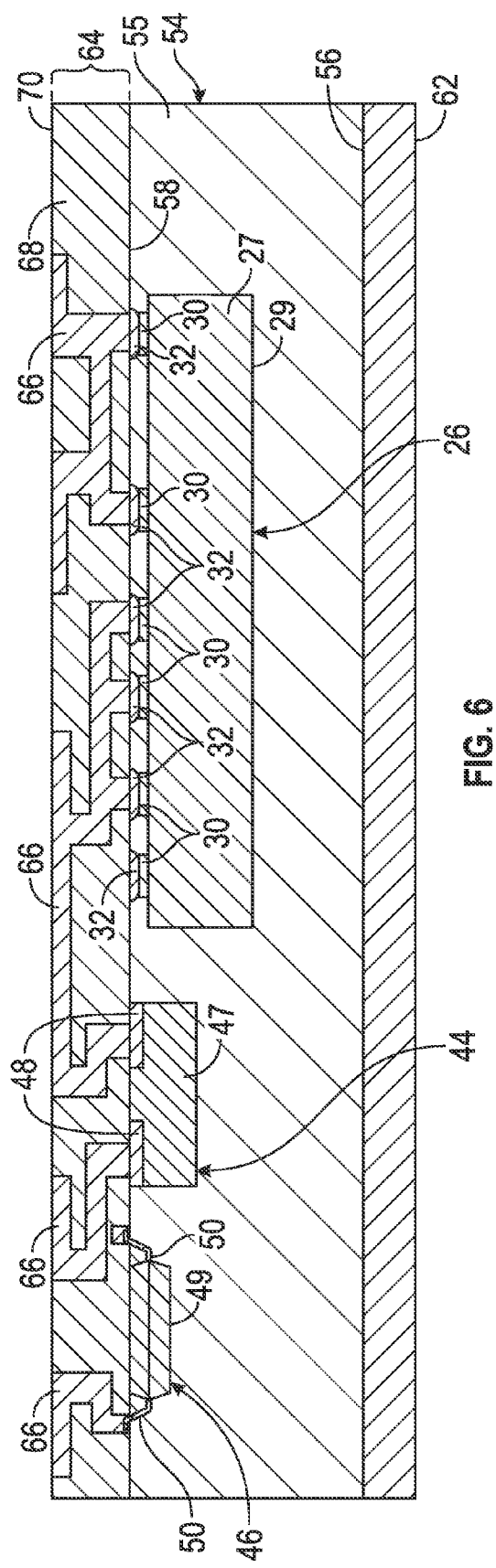

Advancing to STEP 62 of exemplary method 20 (FIG. 1), one or more build-up layers, metal levels, or Redistribution Layers (RDLs) are next formed over planar frontside surface 58 of RCP panel 54. FIG. 6 illustrates the partially-fabricated RCP package after formation of a number of RDL layers 64 over planar frontside 58 of RCP panel 54 (partially shown). Again, it will be noted that only a relatively small portion of RD layers 64 is shown in FIG. 6 and that RDL layers 64 will typically be formed over entire frontside 58 of RCP panel 54 and, thus, over all semiconductor die and microelectronic components embedded therein. RDL layers 64 comprise a number of electrically-conductive interconnect lines 66 formed in a dielectric body 68. Interconnect lines 66 may include various metal traces, vias, metal plugs, and/or the like, which collectively provide electrically-conductive paths between the upper surface 70 of RDL layers 64 and the contacts of die 26, component 44, and component 46 embedded within RCP panel 54. Dielectric body 68 may be formed as a number of successively-deposited (e.g., spun-on) dielectric layers, and interconnect lines 66 may be formed within dielectric body 68 utilizing well-known lithographical patterning and conductive-material deposition processes, such as a metal damascene process. Due to the planar topology of frontside surface 58 of RCP panel 54, RDL layers 64 can be produced with little to no defects despite the structural variance between the bond pads of the semiconductor die (e.g., bond pads 30 of die 26) and the terminals of the microelectronic components (e.g., terminals 48 and 50 of components 44 and 46, respectively) embedded within the molded body 55 of panel 54.

Figure 7:
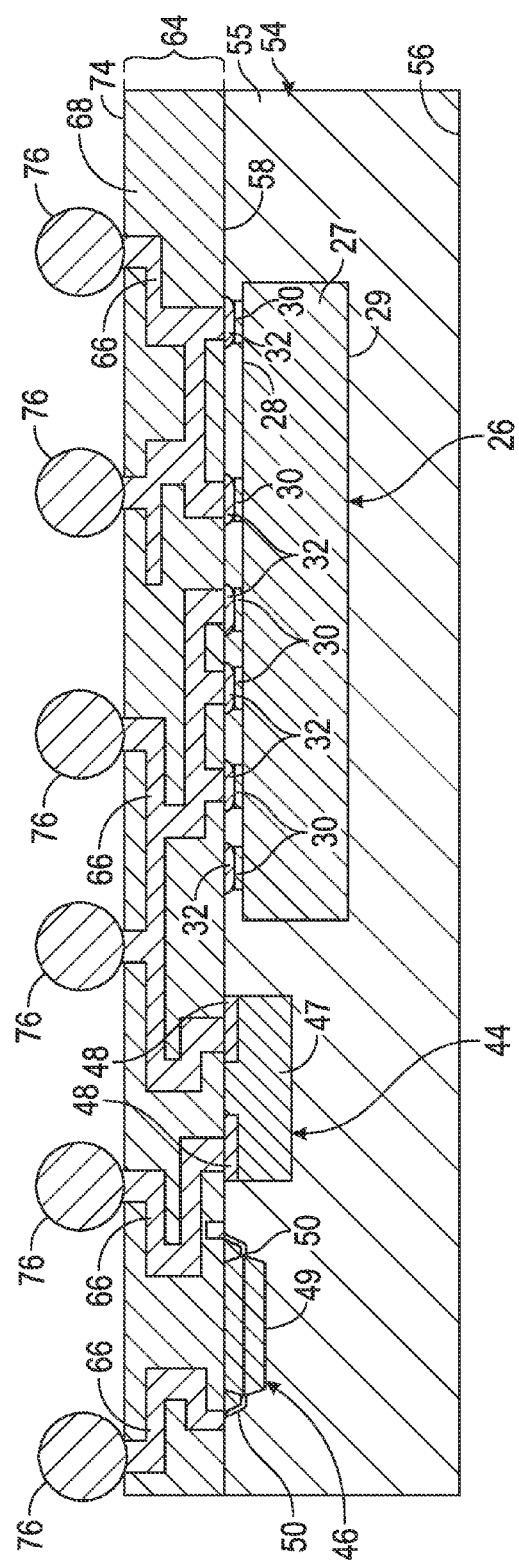

Exemplary method 20 concludes with the formation of a contact array over topside 70 of the partially-completed RCP package and subsequent singulation of the RCP panel (STEP 72, FIG. 1). An uppermost dielectric, capping, or passivation layer 74 may first be formed over RDL layers 64. Passivation layer 74 may the lithographically patterned to form openings to interconnect lines 66, an electrically-conductive material may be deposited into the openings, and the contact array may then be deposited. As shown in FIG. 7, the contact array formed over the RPC package topside may be a Ball Grid Array (BGA) including a plurality of solder balls 76; however, it should be appreciated that, in further embodiments, the contact array may assume any form suitable for providing externally-exposed points-of-contact to the interconnect lines within the RDL layers, such as externally-exposed bond pads in ohmic contact with the RDL interconnect lines or portions of the RDL interconnect lines themselves, which are exposed through the uppermost RDL dielectric or passivation layer. Interconnect lines 66 thus allow electrical communication between solder balls 76 of the BGA and semiconductor die 26, microelectronic component 44, and microelectronic component 46 embedded within RCP panel 54. With respect to semiconductor die 26, in particular, interconnect lines 66 electrically couple solder balls 76 to bond pads 30 through the intervening raised contacts 32 formed thereover. Finally, also during STEP 72 of method 20 (FIG. 1), RCP panel 54 and the overlying RDL layers 64 are separated or singulated to yield a number of completed RCP packages. Separation of the RCP panel 54 is conveniently carried-out utilizing a dicing process, such as mechanical sawing. This results in the production of a number of completed RCP packages, including the completed RCP package shown in FIG. 7.

The foregoing has thus described a method for fabricating one or more RCP packages wherein a relatively smooth or planar frontside surface is created over a molded panel containing semiconductor die in addition to other types of microelectronic components, which may have terminals that vary in shape, structure, and/or disposition as compared to the semiconductor die bond pads. Embodiments of the above-described fabrication process can be usefully employed to package and interconnect semiconductor die with discrete microelectronic components having non-planar terminals, contacts, or leads to yield SiP packages. Notably, the above-described method enables the production of RCP packages containing semiconductor packaged with different types of microelectronic devices, while minimizing surface defects imparted to the redistribution or build-up layers to improve product yield. A plurality of raised contacts may be formed over the bond pads of the semiconductor die to shield the semiconductor die from undesired material loss and potential damage during the planarization (e.g., CMP polishing) process utilized to impart the RCP panel with a substantially planar frontside surface. In the above-described exemplary embodiment, the raised contacts assumed the form of coined stud bumps; however, in further embodiment, the raised contacts can assume other forms, such as plated pillars of the type described below in conjunction with FIGS. 8 and 9.

Figure 8:
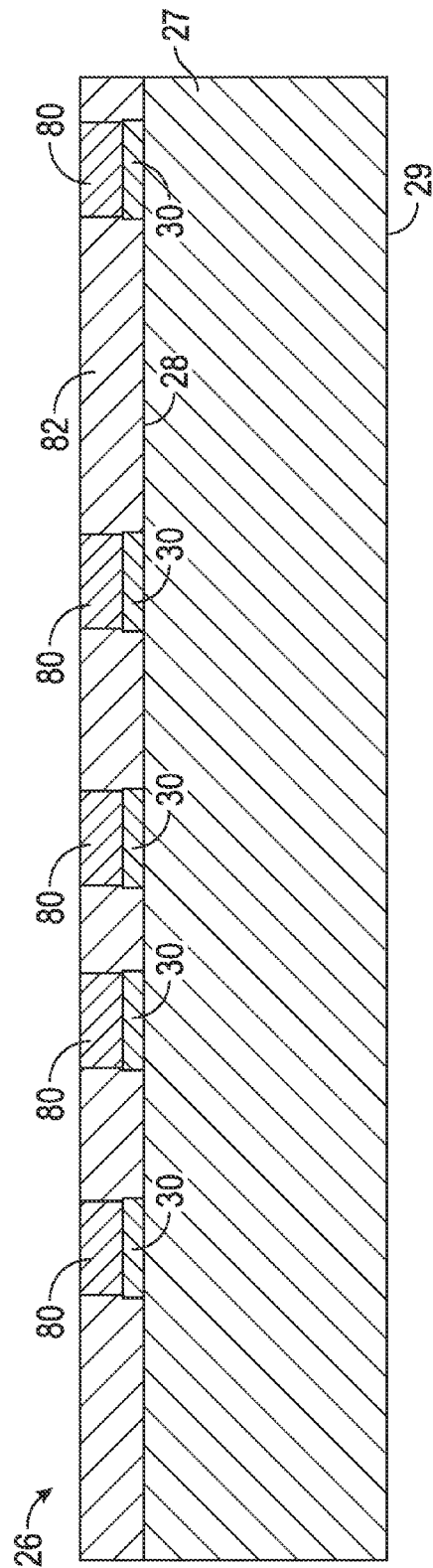
FIGS. 8 and 9 illustrate a second exemplary RCP package containing a semiconductor die having a second type of raised contacts (e.g., plated pillars) formed thereover, as shown at various stages of completion and also produced in accordance with the exemplary fabrication method shown in FIG. 1.
Figure 9:
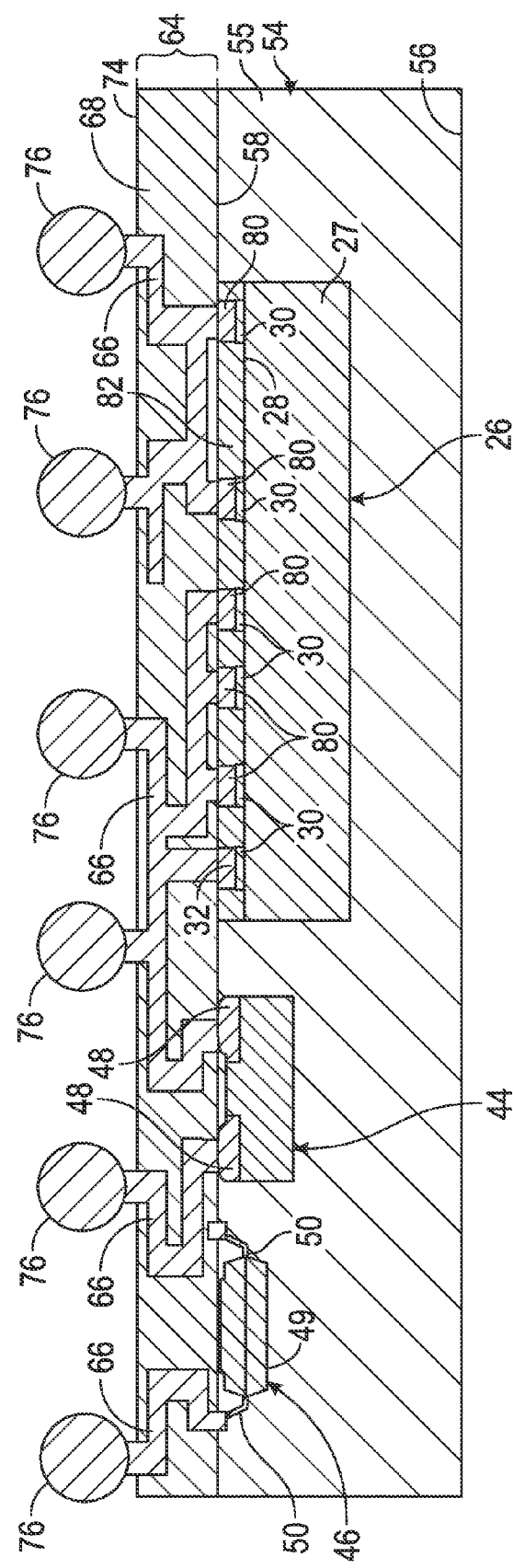

FIG. 8 is a side view of a semiconductor die 26 including a number of bond pads 30. Semiconductor die 26 and bond pads 30 are substantially identical to die 26 and bond pads 30 shown in FIGS. 2-7; hence, like reference numerals have been utilized to identify these structural elements. Furthermore, as was previously the case, a plurality of raised contacts has been formed over bond pads 30 of die 26 during STEP 24 of method 20 (FIG. 1). However, in contrast to semiconductor die 26 shown in FIGS. 2-7, the raised contacts assume the form of a plurality of plated pillars 80. Plated pillars 80 may be formed by, for example, coating the wafer with one or more layers of photoresist, lithographically patterning the photoresist to create openings to bond pads 30, sputtering, and then utilizing a metal plating process to deposit pillars 80. If desired, a layer of dielectric material (referred to herein as "dielectric filler 82") may also be formed over frontside 28 of die 26 surrounding plated pillars 80. By occupying the majority or entirety of the space between plated pillars 80, dielectric filler 82 reduces the likelihood of above-die voiding during the RCP panelization process performed during PROCESS BLOCK 38 of exemplary method 20 (FIG. 1). Dielectric filler 82 can be spun-on or otherwise deposited after formation of plated pillars 80 and prior to singulation of the semiconductor wafer. Alternatively, dielectric filler 82 can be deposited or otherwise formed over frontside 28 of die 26 prior to formation of plated pillars 80 by, for example, patterning filler 82 to create openings therein exposing bond pads 30 and then utilizing a metal plating process to build pillars 80 above bond pads 30 in the previously described manner. After the formation of plated pillars 80 and the surrounding dielectric filler 82, STEPS 36, 40, 52, 60, 62, and 72 of method 20 (FIG. 1) may be carried-out in essentially the same manner as described above to produce at least one RCP package, and typically a relatively large number of RCP packages, containing an embedded semiconductor die having plated pillars formed thereover. An example of one such completed RCP package is shown in FIG. 9.

Multiple exemplary embodiments of a method for fabricating RCP packages have thus been presented wherein raised contacts (e.g., stud bumps or plated pillars) are formed on bond pads of a die that is subsequently embedded on the same plane as is one or more microelectronic components (e.g., discrete microelectronic devices) included within the RCP package. In one embodiment, the method includes the steps/processes of embedding a first semiconductor die and a microelectronic component in a molded panel having a frontside, the first semiconductor die comprising a plurality of bond pads over which a plurality of raised contacts has been formed. The frontside of the molded panel is polished to impart the molded panel with a substantially planar surface through which the terminals of the microelectronic component and the plurality of raised contacts are exposed. Finally, at least one redistribution layer is build or produced over the planar frontside surface to electrically interconnect the first semiconductor die and the microelectronic component.

In another embodiment, the RCP package fabrication method includes the steps/processes of: (i) forming a plurality of raised contacts over the surface of a wafer containing a plurality of semiconductor die; (ii) singulating the wafer to yield a plurality of singulated semiconductor die each having a plurality of raised contacts formed thereover; and (iii) encapsulating the plurality of singulated semiconductor and a plurality of additional microelectronic devices in a molded panel. The plurality of additional microelectronic devices each include a number of microelectronic device terminals. The method further includes the steps/processes of: (iv) polishing the frontside of the molded panel to create a substantially planar surface through which the plurality of raised contacts and the microelectronic device terminals are exposed; (v) producing a plurality of redistribution layers over the molded panel including interconnect lines electrically coupled to the plurality of raised contacts and the microelectronic device terminals; (vi) forming contact arrays over the plurality of redistribution layers in ohmic contact with the interconnect lines; and (vii) separating the panel into a plurality of RCP packages each containing at least one semiconductor device and at least one additional microelectronic device embedded within a molded body.

Finally, while primarily described above in terms of a method for fabrication, it will be appreciated that the foregoing description has also provided embodiments of an RCP package. In one embodiment, the RCP package comprises a microelectronic component having a plurality of terminals. A semiconductor die having a plurality of bond pads is disposed adjacent the microelectronic component. A plurality of raised contacts is formed over the semiconductor die in ohmic contact with the plurality of bond pads. The microelectronic component and the semiconductor die are embedded in molded body, which has a substantially planar build-up or frontside surface through which the plurality of terminals of the microelectronic component and the plurality of raised contacts are exposed. At least one redistribution layer is formed over the substantially planar frontside surface and electrically interconnects the microelectronic component and the semiconductor die. In certain embodiments, the plurality of raised contacts may be a plurality of coined stud bumps and/or a plurality of plated pillars. A dielectric filler material may also be disposed over the microelectronic die and between the plurality of raised contacts, in an embodiment. Additionally, in certain cases, the terminals of the microelectronic component are imparted with flat polished regions exposed through and substantially co-planar with the substantially planar frontside surface of the molded body. The microelectronic component may assume the form of a passive microelectronic device interconnected with the microelectronic die to produce a System-in-Package.

While at least two exemplary embodiment have been described above wherein the raised contacts assumed different forms, namely, coined stud bumps in FIGS. 2-7 and plated pillars in FIGS. 8 and 9, it is emphasized that both types of raised contacts can be formed over a given packaged semiconductor die in further embodiments. Such features are therefore not mutually exclusive in the context of the present disclosure. Additionally, although the provision of the dielectric underfill material was described above in conjunction with the plated pillars described in FIGS. 8 and 9, a layer of dielectric filler material may also be deposited or otherwise formed around stud bumps (e.g., stud bumps in FIGS. 2-7) in further embodiments to reduce the likelihood of voiding during encapsulation, as previously described.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A method for fabricating a Redistributed Chip Package, the method comprising:

embedding a first semiconductor die and a microelectronic component in a molded panel having a frontside, the first semiconductor die comprising a plurality of bond pads over which a plurality of raised contacts has been formed;

polishing the frontside of the molded panel to impart the molded panel with a substantially planar surface through which the terminals of the microelectronic component and the plurality of raised contacts are exposed; and building at least one redistribution layer over the substantially planar surface, the at least one redistribution layer electrically interconnecting the first semiconductor die and the microelectronic component.

2. The method of claim 1 wherein the plurality of raised contacts comprise a plurality of coined stud bumps.

3. The method of claim 1 wherein the plurality of raised contacts comprise a plurality of plated pillars.

4. The method of claim 1 wherein a dielectric filler material has been deposited over the first semiconductor die and fills, at least in substantial part, the space between the plurality of raised contacts.

5. The method of claim 1 wherein polishing the frontside of the molded panel comprises removing a predetermined thickness between about 3 and about 10 microns from the frontside of the molded panel.

6. The method of claim 1 wherein polishing the frontside of the molded panel comprises utilizing a chemical mechanical planarization ("CMP") process to remove a predetermined thickness from the frontside of the molded panel, while also removing an upper portion of the raised contacts and an upper portion of the terminals of the microelectronic component.

7. The method of claim 1 wherein the diameter of each raised contact is substantially equivalent to the width of the bond pad over which the raised contact has been formed.

8. The method of claim 1 wherein the raised contacts are formed to have a height between about 1 and about 10 microns.

9. The method of claim 1 wherein the microelectronic component comprises a passive microelectronic device, and wherein the at least one redistribution layer electrically interconnects the semiconductor die and the passive device to produce a System-In-Package.

10. The method of claim 1 wherein the microelectronic component comprises a leaded package.

11. The method of claim 10 wherein the leaded package is selected from the group consisting of a J-lead package and a gullwing package.

12. The method of claim 1 further comprising:
forming the plurality of raised contacts over the first semiconductor die while the first semiconductor die remains joined to a plurality of other semiconductor die in the form of a non-singulated wafer; and
singulating the non-singulated wafer to produce a plurality semiconductor die over which a plurality of raised contacts has been formed, the plurality of semiconductor die including the first semiconductor die.

13. A method for fabricating a Redistributed Chip Package (RCP), the method comprising:
forming a plurality of raised contacts over the surface of a wafer containing a plurality of semiconductor die;
singulating the wafer to yield a plurality of singulated semiconductor die each having a plurality of raised contacts formed thereover;
encapsulating the plurality of singulated semiconductor die and a plurality of additional microelectronic devices in a molded panel, the plurality of additional microelectronic devices each including a number of microelectronic device terminals;

polishing the frontside of the molded panel to create a substantially planar surface through which the plurality of raised contacts and the microelectronic device terminals are exposed;

producing one or more redistribution layers over the molded panel including interconnect lines electrically coupled to the plurality of raised contacts and the microelectronic device terminals;

forming contact arrays over the plurality of redistribution layers in ohmic contact with the interconnect lines; and separating the panel into a plurality of RCP packages each containing at least one semiconductor device and at least one additional microelectronic device embedded within a molded body.

14. The method of 13 further comprising depositing a dielectric filler material over the frontside surface of the semiconductor die surrounding the plurality of raised contacts prior to encapsulating the plurality of singulated semiconductor die and the plurality of additional microelectronic devices in the molded panel.

15. A Redistributed Chip Package, comprising:
a microelectronic component having a plurality of terminals;
a semiconductor die having a plurality of bond pads and disposed adjacent the microelectronic component;
a plurality of raised contacts located over the semiconductor die in ohmic contact with the plurality of bond pads;
a molded body in which the microelectronic component and the semiconductor die are embedded, the molded body having a substantially planar frontside surface through which the plurality of terminals of the microelectronic component and the plurality of raised contacts are exposed; and
at least one redistribution layer located over the substantially planar frontside surface and electrically interconnecting the microelectronic component and the semiconductor die.

16. The multi-component microelectronic package of claim 15 wherein the plurality of raised contacts comprises a plurality of coined stud bumps.

17. The multi-component microelectronic package of claim 15 wherein the plurality of raised contacts comprises a plurality of plated pillars.

18. The multi-component microelectronic package of claim 17 wherein each of the plurality of plated pillars has a height between about 1 and about 15 microns.

19. The multi-component microelectronic package of claim 15 further comprising a dielectric filler disposed over the microelectronic die and between the plurality of raised contacts.

20. The multi-component microelectronic package of claim 15 wherein the terminals of the microelectronic component are imparted with flat polished regions that are exposed through and substantially co-planar with the substantially planar frontside surface of the molded body.

* * * * *